(12) United States Patent
Inomoto

(10) Patent No.: US 6,319,638 B1
(45) Date of Patent: Nov. 20, 2001

(54) SEMICONDUCTOR DEVICE MANUFACTURING METHOD OF ACCURATELY PERFORMING ALIGNMENT OF PATTERNING, MASK FOR EXPOSURE

(75) Inventor: Yasumasa Inomoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/538,477

(22) Filed: Mar. 30, 2000

(30) Foreign Application Priority Data

Mar. 30, 1999 (JP) .................................................. 11-088905

(51) Int. Cl.[7] .................................................. G03F 9/00
(52) U.S. Cl. .................................................. 430/5; 430/22
(58) Field of Search .................................................. 430/5, 22

(56) References Cited

FOREIGN PATENT DOCUMENTS 5-323575    12/1993    (JP) .

*Primary Examiner*—Christopher G. Young
(74) *Attorney, Agent, or Firm*—Sughrue, Mion, Zinn, Macpeak & Seas, PLLC

(57) ABSTRACT

A method of forming markers in manufacture with excellent productivity of a semiconductor device capable or forming the markers accurately aligned with the crystal direction in the same position of a semiconductor crystal substrate is provided. There is a marker forming method of forming a stepper marker pattern part (202) on the main surface of a semiconductor crystal substrate (101), and a mask (201) for exposure is overlaid on the position where segment-shaped patterns (205) formed on the main surface of the mask (201) for exposure match with a cleavage orientation flat (102) of the semiconductor crystal substrate (101), and the stepper marker pattern part is transferred by contact exposure. Because of this, the stepper marker pattern part (202) can be formed in the same position within the semiconductor crystal substrate (101). As a result of this, by using a stepper aligner with an automatic alignment function, operating efficiency of an exposure process improves and high productivity can be obtained.

7 Claims, 13 Drawing Sheets

SEMICONDUCTOR DEVICE MANUFACTURING METHOD OF ACCURATELY PERFORMING ALIGNMENT OF PATTERNING, MASK FOR EXPOSURE

BACKGROUND OF THE INVENTION

1. Field of the Related Art

The present invention relates to manufacture of a semiconductor device, and particularly to a method of performing alignment in the case of exposure.

2. Description of the Invention

In manufacturing processes of a semiconductor laser, each chip is separated by cleavage. The semiconductor laser forms a resonator using a cleavage plane as a Miller plane. Thus, it is important to form an optical waveguide in the direction vertical to the cleavage plane (parallel to a crystallographic axis).

On the other hand, stripe width control of an active region is very important in order to improve controllability and uniformity of characteristics of the semiconductor laser, and use of patterning by stepper exposure has effective in the control. Also, in manufacture of a DFB (Distributed Feedback) type laser, it is significant to control a shape and a period of a diffraction grating, and use of patterning by EB (Electron Beam) exposure has effective in the control.

As a result of this, when the semiconductor laser is manufactured using an aligner, the crystal direction of a semiconductor must be accurately aligned with the direction of a marker pattern for aligning in the case of exposure.

As a method of performing this, a manufacturing method of a semiconductor device and an alignment method for providing a mark for alignment in a mask for exposure and performing alignment by this mark are disclosed in Japanese Patent Unexamined Publication No. 323575 of 1993.

In the manufacturing method disclosed in Japanese Patent Unexamined Publication No. 323575 of 1993, however, no consideration is given to accuracy in position within a substrate plane of the marker pattern, with the result that the marker pattern cannot be always formed in the same position of a substrate. Because of this, in the stepper exposure or the EB exposure, it is necessary to search the position of a stepper marker or an EB marker in manual operations, and thus, it is lacking in productivity.

SUMMARY OF THE INVENTION

An object of the present invention is to provide a method of forming markers in manufacture with excellent productivity of a semiconductor device capable of forming the markers accurately aligned with the crystal direction in the same position of a semiconductor crystal substrate.

A method of manufacturing a semiconductor device according to the present invention comprises the steps of providing a semiconductor crystal substrate having a cleavage orientation flat; providing a mask for exposure in which an alignment pattern is formed, the alignment pattern comprising a segment-shaped pattern which is a chord joining two points on a circular arc matching with an outer peripheral circle of the semiconductor crystal substrate and corresponds to the cleavage orientation flat; aligning the mask for exposure with the semiconductor crystal substrate so as to match the cleavage orientation flat with the segment-shaped pattern; and transferring the pattern formed in the mask for exposure on the semiconductor crystal substrate.

Also, an alignment method according to the present invention comprises the steps of forming an alignment pattern in a mask for exposure, the alignment pattern comprising a segment-shaped pattern which is a chord joining two points on a circular arc matching with an outer peripheral circle of a semiconductor crystal substrate having a cleavage orientation flat and corresponds to the cleavage orientation flat; and aligning the mask for exposure with the semiconductor crystal substrate so as to match the cleavage orientation flat with the segment-shaped pattern.

According to the present invention, using a semiconductor crystal substrate (wafer) having an orientation flat formed by cleavage, the cleavage orientation flat is utilized as alignment standards of patterning. That is, a segment-shaped pattern with the same length as the cleavage orientation flat is formed in a mask for exposure and alignment is performed so as to match the segment-shaped pattern with the cleavage orientation flat.

When the cleavage orientation flat with a length of L is formed in the wafer with a diameter of D, a length R of a perpendicular extending to the cleavage orientation flat from the center of this wafer is given by an expression of $R=\text{SQRT}\{(D/2)^2-(L/2)^2\}$, where SQRT indicates square root. Thus, when using a predetermined wafer, the distance R is uniquely determined by the length L of the cleavage orientation flat.

Using this, an alignment pattern comprising segments with the same length as the cleavage orientation flat is formed in the mask for exposure and alignment is performed so as to match them, and thereby a transfer pattern (such as stepper markers) can be always formed in the same position of the wafer. That is, the stepper markers can be aligned with the crystal axis with high accuracy.

Also, in consideration of change in length of the cleavage orientation flat due to variation of machining, it is effective to form an alignment pattern comprising plural segment-shaped patterns with different lengths changed according to the distance from the center of the wafer. By performing alignment according to the best matching segment-shaped pattern, measures can be effectively taken even in the presence of the variation of machining. In this case, the plural segment-shaped patterns have to be accurately set according to the above R. That is, the mask for exposure has the plural segment-shaped patterns which are a chord joining two points on a circular arc matching with an outer peripheral circle of the semiconductor crystal substrate (wafer) and are parallel one another.

When the stepper markers are formed on the semiconductor crystal substrate in such a manner, various patternings necessary in using a stepper aligner with an automatic alignment function can be performed. Further, similar effect can be obtained in an EB aligner with an automatic alignment function.

BRIEF DESCRIPTION OF THE DRAWINGS

The above and other objects, features and advantages of the present invention will be more apparent from the following description taken in conjunction with the accompanying drawings.

DETAILED DESCRIPTION OF THE PREFERRED EMBODIMENTS

A first embodiment of a manufacturing method of a semiconductor device and an alignment method according to the present invention will be described with reference to FIGS. 1 to 3.

Figure 1:
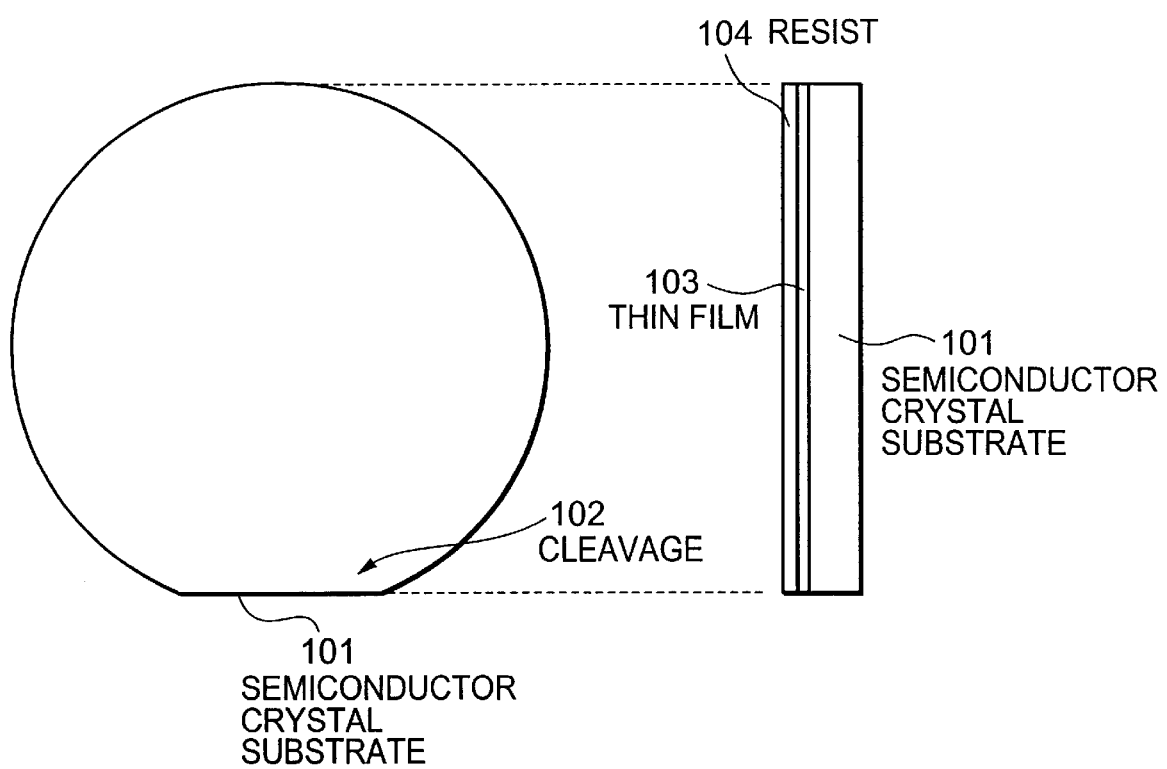
FIG. 1 is an illustration showing a configuration example of a semiconductor crystal substrate in a first embodiment.

FIG. 1 is an illustration showing a configuration example of a semiconductor crystal substrate in the first embodiment. A semiconductor crystal substrate 101 has an orientation flat. The orientation flat is formed by cleaving the end of the circular semiconductor crystal substrate (hereinafter called "cleavage OF"). Here, as one example, a substrate with a diameter of 2 in. comprising an InP crystal with (100) plane orientation, in which the cleavage OF 102 is 20 mm in length, is used for the semiconductor crystal substrate 101. A thin film 103 is formed on the main surface of the semiconductor crystal substrate 101. Here, as one example, the $SiO_2$ film with a thickness of 100 nm is formed (for example, by a thermal CVD method). A resist 109 is applied on the thin film 103.

Figure 2:
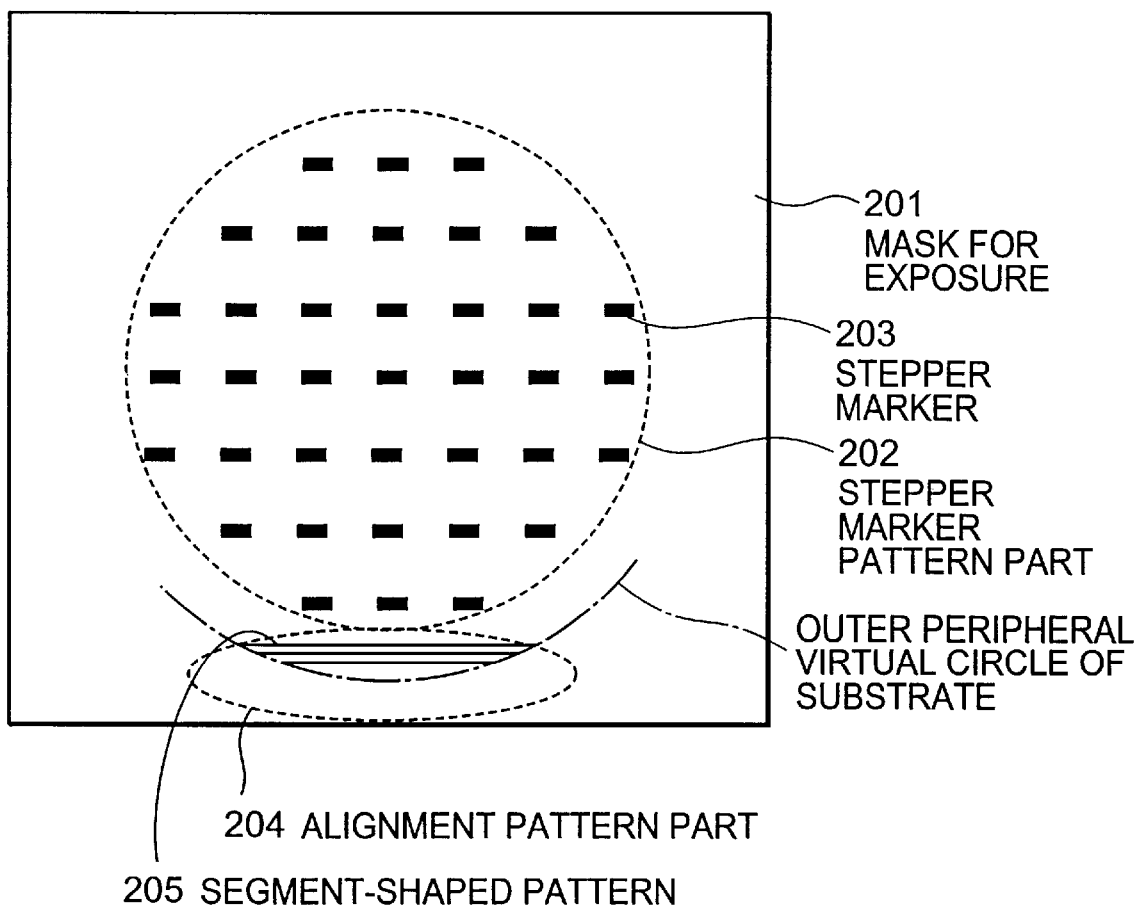
FIG. 2 is a plan view showing a mask for exposure in the first embodiment.

FIG. 2 is a plan view showing a mask for exposure in the first embodiment. A mask 201 for exposure comprises, for example, a transparent quartz glass substrate. A stepper marker pattern part 202 and an alignment pattern part 204 are formed on the main surface of the mask 201 for exposure.

The stepper marker pattern part 202 comprises plural stepper markers 203 formed on the main surface of the mask 201 for exposure. Each stepper marker 203 is formed of a thin film for shading. The thin film for shading includes, for example, metal such as chromium, silicon, molybdenum silicide.

The alignment pattern part 204 comprises plural segment-shaped patterns 205. Each segment-shaped pattern 205 corresponds to a chord of a virtual circle matching with an outer peripheral circle of the semiconductor crystal substrate 101. These segment-shaped patterns 205 are arranged parallel one another at regular intervals. In consideration of machining accuracy of the cleavage OF 102, the length of the segment-shaped pattern with the position near to the center of the virtual circle is longer than that of the cleavage OF 102, and the length of the segment-shaped pattern with the position distant from the center of the virtual circle is shorter than that of the cleavage OF 102. The space between the adjacent segment-shaped patterns is, for example, 100 to 200 $\mu$m. Here, as one example, the space between the adjacent segment-shaped patterns is set to 100 $\mu$m. Each segment-shaped pattern 205 is formed of a thin film for shading. The thin film for shading includes, for example, metal such as chromium, silicon, molybdenum silicide.

Figure 3:
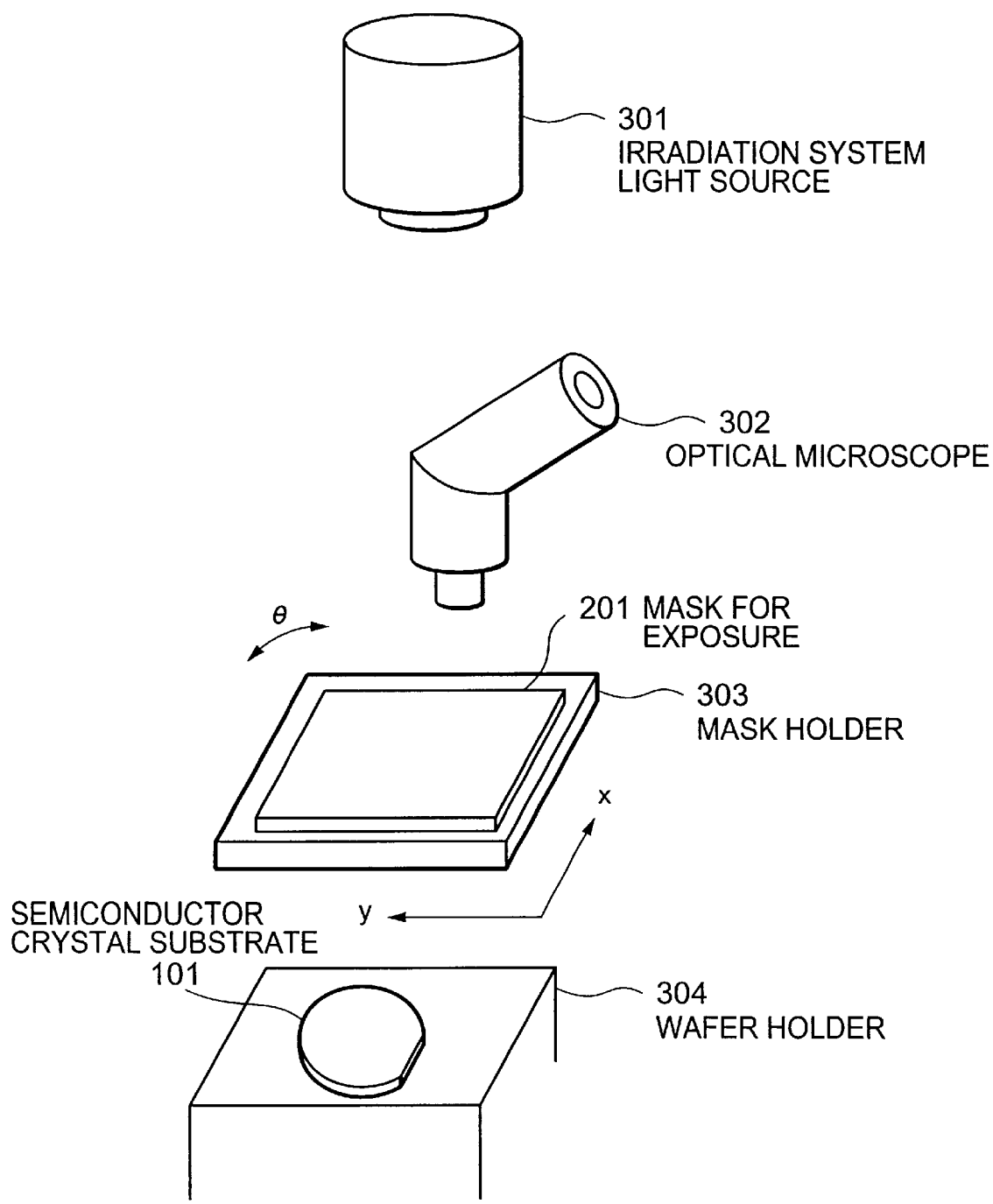
FIG. 3 is an illustration showing one example of a contact aligner used in the first embodiment.

FIG. 3 is a diagrammatic illustration showing one example of a contact aligner used in the first embodiment. The contact aligner includes an irradiation system light source 301, an optical microscope 302, a mask holder 303, and a wafer holder 304.

The irradiation system light source 301 is a light source used in performing contact exposure. In the contact exposure, generally, exposure is performed using ultraviolet light. Thus, the wavelength of the irradiation system light source 301 is, for example, 350 to 450 nm.

The optical microscope 302 is used in aligning the mask 201 for exposure with the semiconductor crystal substrate 101. The optical microscope 302 has resolving power capable of sufficiently discriminating an object with a size of about 1 $\mu$m. When the contact exposure is performed, the optical microscope 302 is saved to the position so as not to interfere with the exposure.

The mask holder 303 secures the mask 201 for exposure by vacuum suction, and the wafer holder 304 secures the semiconductor crystal substrate 101 by vacuum suction. The mask holder 303 or the wafer holder 304 is driven by, for example, a stepping motor, etc. and vertical movement, rotation within a horizontal plane, and x, y-axial movement can be performed. For example, the x, y-axial and vertical movement can be performed by several $\mu$m (2 to 3 $\mu$m). Here, as one example, the x, y-axial and vertical movement can be performed by 2 $\mu$m.

First, the distance between the mask holder 303 and the wafer holder 304 is enough kept. The semiconductor crystal substrate 101 and the mask 201 for exposure are secured on the wafer holder 304 and mask holder 303, respectively, by the vacuum suction. Then, the mask holder 303 is brought near over the wafer holder 304. In this case, the distance between the mask holder 303 and the wafer holder 304 is kept, for example, by several $\mu$m (2 to 3 $\mu$m). Here, as one example, the distance between the mask holder 303 and the wafer holder 304 is kept by 2 $\mu$m.

Next, an operator performs alignment by manipulating the mask holder 303 and the wafer holder 304 while observing the alignment pattern part 204 and the cleavage OF 102 through the optical microscope 302.

For example, the segment-shaped pattern 205 with the same length as the cleavage OF 102 is selected from the group of the segment-shaped patterns 205 constituting the alignment pattern part 204. Next, orientation of the mask 201 for exposure is adjusted and this segment-shaped pattern 205 is brought into parallel with the cleavage OF 102 each other. Then, the mask 201 for exposure is moved to the position where the segment-shaped pattern 205 perfectly matches with the cleavage OF 102 parallel to itself. In this manner, the alignment is performed.

When the alignment is completed, the optical microscope 302 is saved to the position so as not to interfere with the contact exposure. Next, the mask 201 for exposure is overlaid on the semiconductor crystal substrate 101. Then, the mask 201 for exposure is brought into close contact with the semiconductor crystal substrate 101. Then, the stepper marker pattern part 202 is engraved on the thin film 103 through development, wet etching, and removal of the resist 104. Thereafter, the stepper marker pattern part 202 is engraved on the semiconductor crystal substrate 101 through wet etching.

Assuming that the length of the cleavage OF 102 is L and the distance from the center of the senmiconductor crystal substrate 101 to the cleavage OF 102 is R, for a wafer with a diameter of 2 in. (50 mmφ), the following expression of relation holds with reference to R and L.

$$R=SQRT(25^2-(L/2)^2) \; SQRT: \text{square root}$$

That is, the distance R from the center of the semiconductor crystal substrate 101 to the cleavage OF 102 is uniquely determined if the length L of the cleavage OF 102 is determined.

Therefore, each the stepper marker 203 can always be formed in the same position within the semiconductor crystal substrate 101 by overlaying the mask 201 for exposure to the position where the cleavage OF 102 matches with one of the segment-shaped patterns 205 of the alignment pattern part 204. Also, the crystal direction of the semiconductor crystal substrate 101 can be aligned with the direction of the stepper marker pattern part 202 with high accuracy.

FIG. 4 is a flow diagram showing formation processes of one element of a Fabry-Perot type semiconductor laser.

First, a resist 104 is applied on a thin film 103. Next, a reticle and a semiconductor crystal substrate 101 are mounted in a predetermined position of a stepper aligner. Then, using an automatic alignment function of the stepper aligner, the position of each the stepper marker 203 is detected by a laser beam and alignment in the case of exposure is carried out and exposure is performed. Here, as one example, the exposure is performed using g-line. After that, a pair of stripe-shaped resist patterns are formed through development. Then, a pair of stripe-shaped selective growth masks 401 are formed on the thin film 103 through wet etching and resist removal. Here, as one example, a pair of the stripe-shaped selective growth masks 401, in which the stripe is 5 μm in width and the space between the stripes is 1 μm, are formed in the direction of <011> (FIG. 4(a)).

Figure 4A:
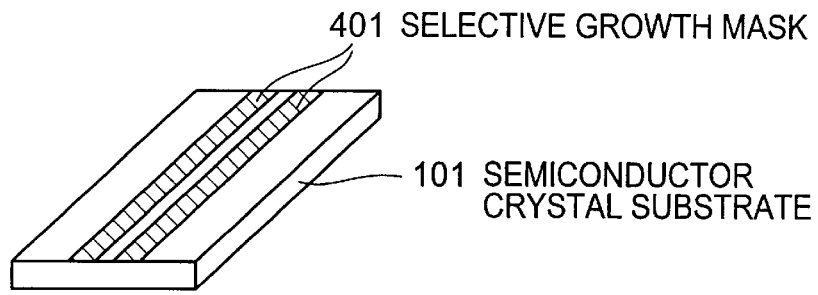
FIGS. 4(A)–(D) is a flow diagram showing formation processes of one element of a Fabry-Perot type semiconductor laser.
Figure 4B:
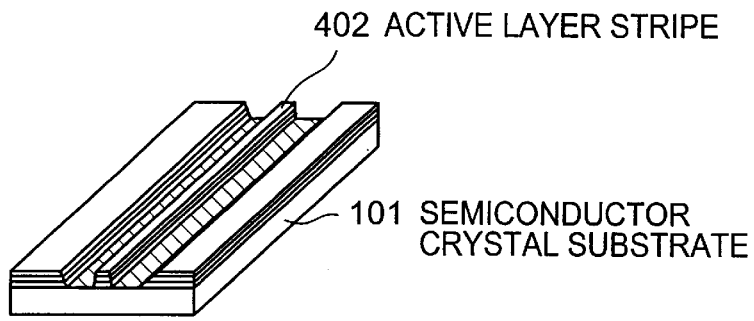
Figure 4C:
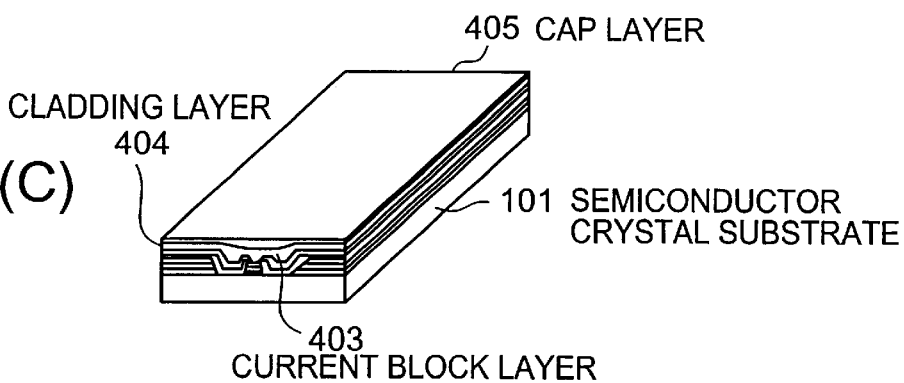
Figure 4D:
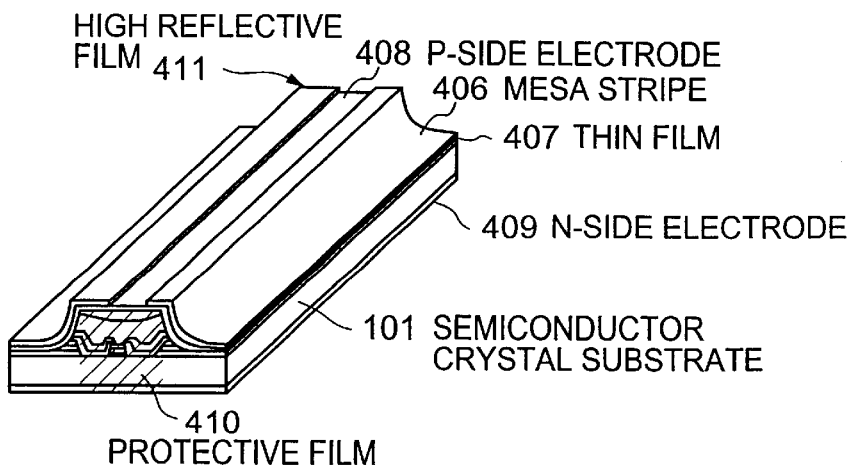

Next, an active layer stripe 402 is formed by stacking an n-InP layer, an n-type InGaAsP optical confinement layer, a non-dope MQW (Multiple Quantum Well) active layer, a non-dope InGaAsP optical confinement layer, and a p-InP cladding layer in this order (FIG. 4(b)).

As one example, each layer has the following structure. The n-InP layer has a layer thickness of 0.1 μm and a carrier concentration of $5 \times 10^{17}$ cm$^{-3}$. The n-type InGaAsP optical confinement layer has a layer thickness of 60 nm, a carrier concentration of $5 \times 10^{17}$ cm$^{-3}$ and a band gap wavelength of 201 μm. The non-dope MQW active layer forms the multiple quantum well structure of seven periods by alternately stacking InGaAsP well layers (with a layer thickness of 5 nm and a band gap wavelength of 1.29 μm) to which a compressive strain of +0.7% is applied and barrier layers (with a layer thickness of 10 nm and a band gap wavelength of 201 μm). The non-dope InGaAsP optical confinement layer has a layer thickness of 60 nm and a band gap wavelength of 201 μm. The p-InP cladding layer has a layer thickness of 0.1 μm and a carrier concentration of $5 \times 10^{17}$ cm$^{-3}$.

Then, a thin film is formed on all the main surface of the semiconductor crystal substrate 101. Here, as one example, the thin film comprising an SiO$_2$ with a thickness of 350 nm is formed by a thermal CVD method. Then, a resist is applied on the thin film. Then, a reticle and the semiconductor crystal substrate 101 are mounted in a predetermined position of a stepper aligner. Then, using an automatic alignment function of the stepper aligner, the position of each the stepper marker 203 is detected by a laser beam and alignment in the case of stepper exposure is carried out and exposure is performed. Here, as one example, the exposure is performed using g-line. After that, a resist pattern is formed on an active layer stripe 402 through development, Then, selective growth masks are formed on the active layer stripe 402 through wet etching and resist removal.

Then, a current block layer 403 is formed. Here, as one example, the current block layer 403 is formed by sequentially stacking a p-InP layer (with a layer thickness of 0.5 μm and a carrier concentration of $5 \times 10^{17}$ cm$^{-3}$), an n-InP layer (with a layer thickness of 1.2 μm and a carrier concentration of $1 \times 10^{18}$ cm$^{-3}$) and a p-InP layer (with a layer thickness of 0.2 μm and a carrier concentration of $5 \times 10^{17}$ cm$^{-3}$) by a selective MOVPE (Metal Organic Vapor Phase Growth System) method under a growth pressure of 75 Torr and a growth temperature of 625° C. Thereafter, the selective growth masks are removed, and a p-InP cladding layer 404 and ap-InGaAs cap layer 405 are formed. Here, as one example, the p-InP cladding layer 404 (with a layer thickness of 1.5 μm and a carrier concentration of $1 \times 10^{18}$ cm$^{-3}$) and the p-InGaAs cap layer 405 (with a layer thickness of 0.2 μm and a carrier concentration of $5 \times 10^{17}$ cm$^{-3}$) are formed in this order by a MOVPE growth under a growth pressure of 75 Torr and a growth temperature of 625° C. Thus, crystal growth is completed (FIG. 4(c)).

Then, a mesa stripe 406 is formed by photography and wet etching. Here, as one example, the mesa stripe with a width of 10 μm is formed. Then, a thin film 407 is formed. Here, as one example, the SiO$_2$ thin film with a thickness of 350 nm is formed. Then, a window for contact is opened by photography and wet etching. Then, Ti/Au are deposited by a sputtering method. Here, as one example, the Ti/Au are deposited by the thickness of 100/300 nm, respectively. Then, a p-side electrode 408 is formed by normal photography arid wet etching. Then, the back of the semiconductor crystal substrate 101 is polished. As one example, the back of semiconductor crystal substrate 101 is polished to be formed in thickness to 90 μm. Then, Ti/Au are deposited on the back of semiconductor crystal substrate 101 by a sputtering method (as one example, the Ti/Au are deposited by the thickness of 100/300 nm, respectively), and an n-side electrode 409 is formed, and sintering is performed in an atmosphere of N$_2$.

Finally, each element is separated by cleavage, and a protective film 410 with low reflectance is formed on the end of a light output side and a high reflective film 411 is formed on the opposite end. As one example, the cleavage is carried out so as to form each element with a length of 300 μm, and the protective film 410 with a reflectance of 30% is formed on the end of the light output side and the high reflective film 411 with a reflectance of 70% is formed on the opposite end. Thus, a Fabry-Perot type semiconductor laser element is completed (FIG. 4(d)).

As described above, the stepper marker pattern part 202 can always be formed in the same position within the semiconductor crystal substrate 101 by aligning the semiconductor crystal substrate 101 with the mask 201 for exposure. As a result, by using a stepper aligner with an automatic alignment function, the position of each the stepper marker 203 can be automatically detected by a laser beam etc. To automate alignment in the case of stepper exposure. Thus, operating efficiency of an exposure process improves, with the result that high productivity can be obtained.

Also, the crystal axis direction (<011> direction) of the semiconductor crystal substrate 101 can be aligned with the direction of each the stepper marker 203 with high accuracy. As a result, the deviation of angle of the selective growth masks 401 (thus, the active layer stripe 402) to the crystal axis direction can be reduced to 0.01 degrees or less.

Since the stepper marker pattern part 202 is formed in the same position within the semiconductor crystal substrate 101 and the direction of each the stepper marker 203 is accurately aligned with the crystal axis direction of the semiconductor crystal substrate 101, the width of the active layer stripe 402 can be controlled with enough high accuracy by using a stepper aligner and a semiconductor laser having good characteristics can be manufactured.

Evaluation of the Fabry-Perot type semiconductor laser element manufactured as described above resulted in good values with an oscillation threshold of 8 mA, a slope efficiency of 0.50 W/A at room temperature, and an oscillation threshold of 16 mA, a slope efficiency of 0.39 W/A and a drive current (for light output of 10 mW) of 50 mA or less at a temperature of 85° C. Also, variations in threshold and slope efficiency within a wafer were ±0.5 mA and ±0.05 W/A, respectively, and good uniformity was obtained.

A second embodiment of a manufacturing method of a semiconductor device and an alignment method according to the present invention will be described with reference to FIGS. 5 to 7.

Figure 5:
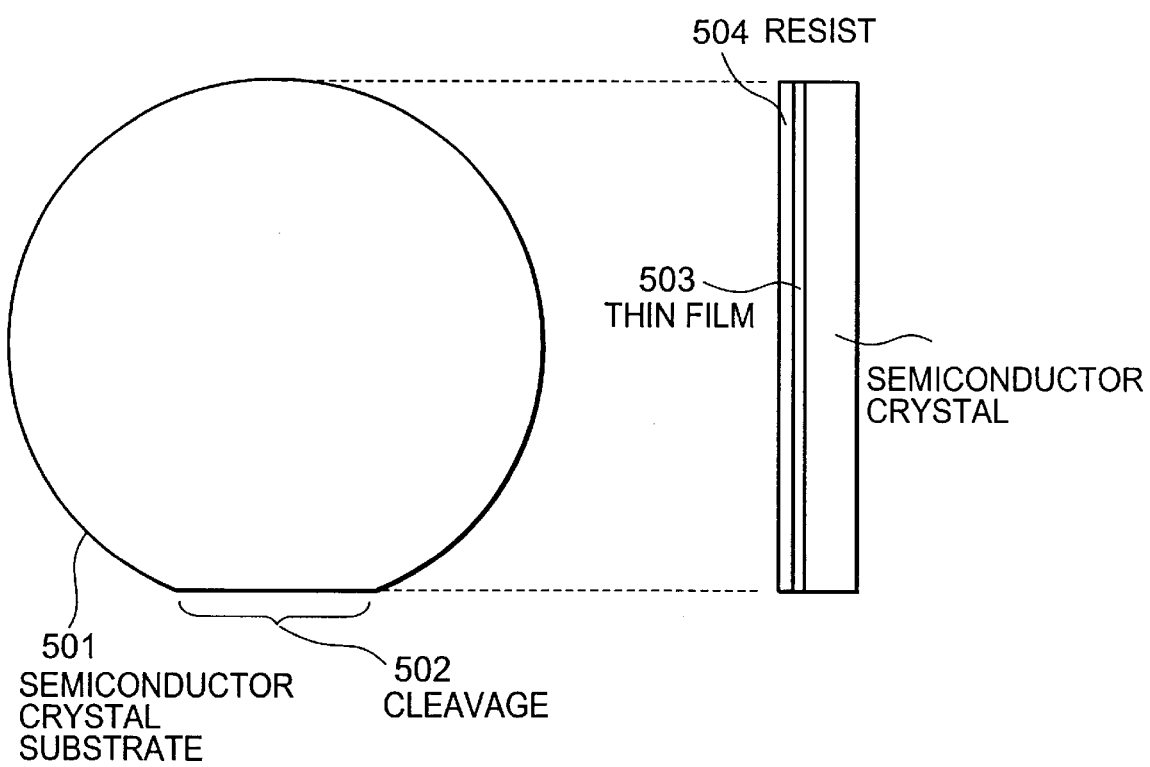
FIG. 5 is an illustration showing a configuration example of a semiconductor crystal substrate in a second embodiment.

FIG. 5 is an illustration showing a configuration example of a semiconductor crystal substrate in the second embodiment. A semiconductor crystal substrate 501 has a cleavage OF 502. Here, as one example, a substrate with a diameter of 2 in. comprising an n-type InP crystal with (100) plane orientation, in which the cleavage OF 502 is 20 mm in length and a carrier concentration is $1 \times 10^{18}$ cm$^{-3}$, is used for the semiconductor crystal substrate 501. A thin film 503 is formed on the main surface of the semiconductor crystal substrate 501. Here, as one example, the SiO$_2$ film with a thickness of 100 nm is formed (for example, by a thermal CVD method). A resist 504 is applied on the thin film 503.

Figure 6:
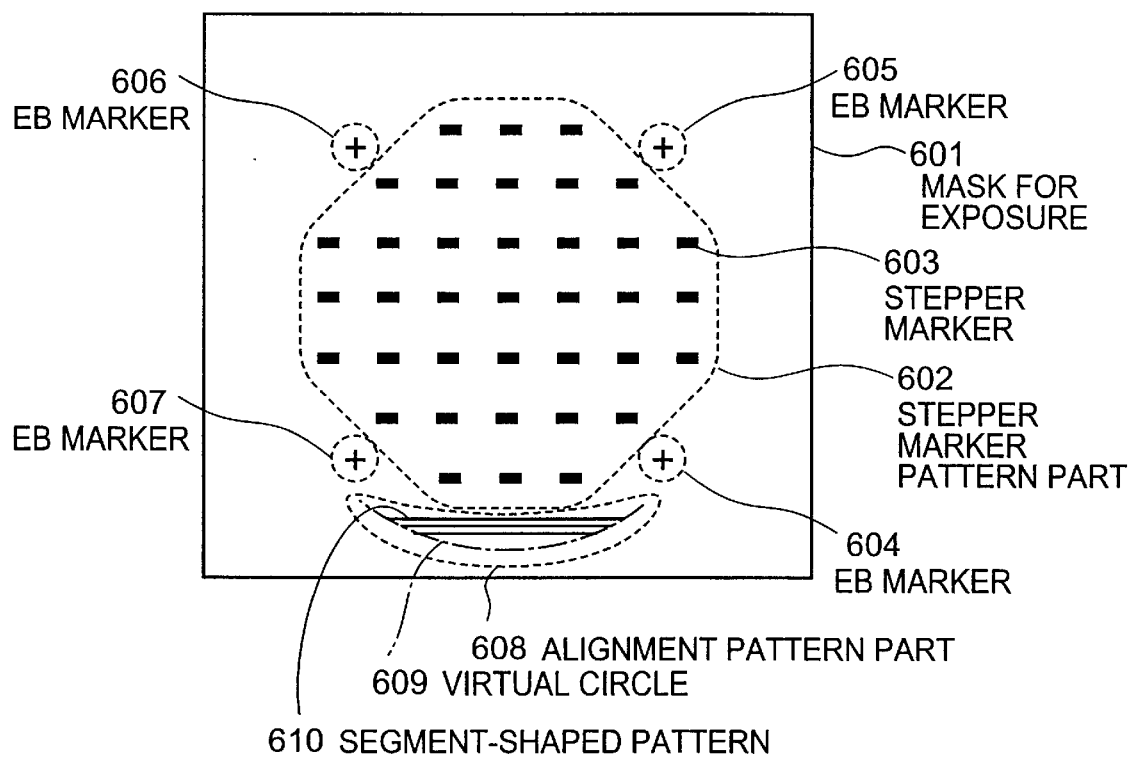
FIG. 6 is a plan view showing a mask for exposure in the second embodiment.

FIG. 6 is a plan view showing a mask for exposure in the second embodiment. A mask 601 for exposure comprises, for example, a transparent quartz glass substrate. A stepper marker pattern part 602, EB markers 604, 605, 606, 607 and an alignment pattern part 608 are formed on the main surface of the mask 601 for exposure.

The stepper marker pattern part 602 comprises plural stepper markers 603 formed on the main surface of the mask 601 for exposure. Each stepper marker 603 is formed of a thin film for shading. The thin film for shading includes, for example, metal such as chromium, silicon, molybdenum silicide.

The EB markers 601, 605, 606, 607 are formed of a thin film for shading. The thin film for shading includes, for example, metal such as chromium, silicon, molybdenum silicide.

The alignment pattern part 608 comprises plural segment-shaped patterns 610 which correspond to a chord of a virtual circle 609 matching with an outer peripheral circle of the semiconductor crystal substrate 501 and are arranged parallel one another at regular intervals. In consideration of machining accuracy of the cleavage OF 502, the length of the segment-shaped pattern with the position near to the center of the virtual circle 609 is longer than that of the cleavage OF 502, and the length of the segment-shaped pattern with the position distant from the center of the virtual circle 609 is shorter than that of the cleavage OF 502. The space between the adjacent segment-shaped patterns is, for example, 100 to 200 μm. Here, as one example, the space between the adjacent segment-shaped patterns is set to 100 μm. Each segment-shaped pattern 610 is formed of a thin film for shading. The thin film for shading includes, for example, metal such as chromium, silicon, molybdenum silicide.

Figure 7:
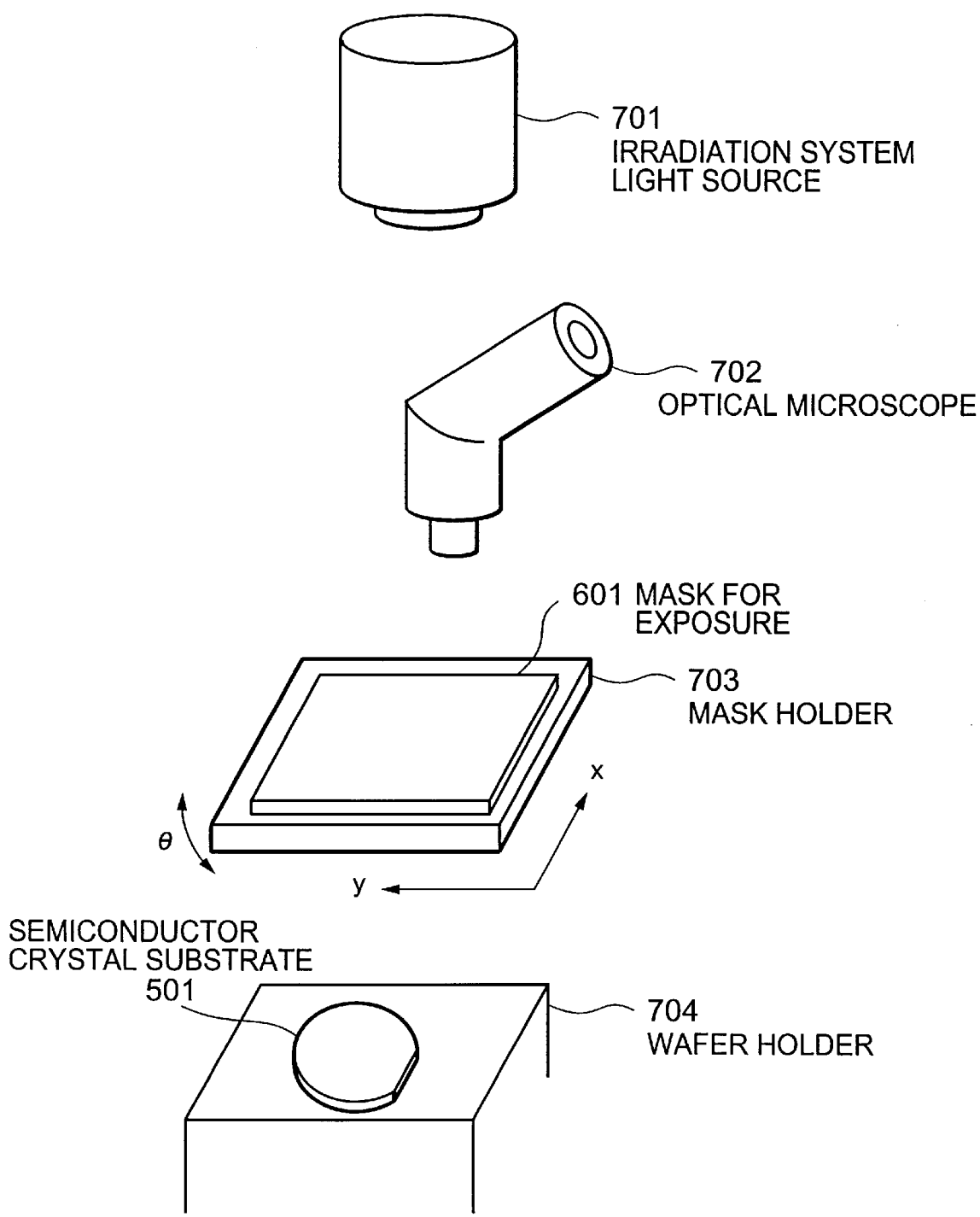
FIG. 7 is an illustration showing one example of a contact aligner used in the second embodiment.
Figure 8A:
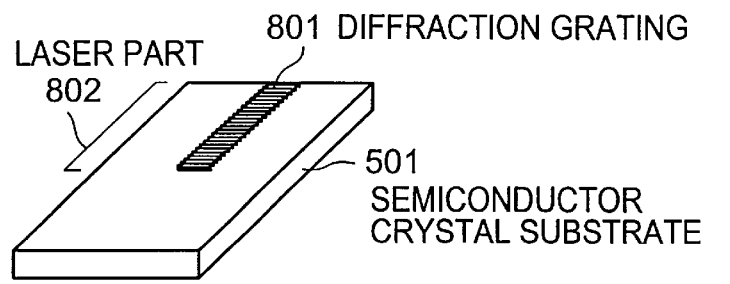
FIGS. 8(A)–8(E) is a flow diagram showing formation processes of one element of a modulator integrated type DFB laser.
Figure 8B:
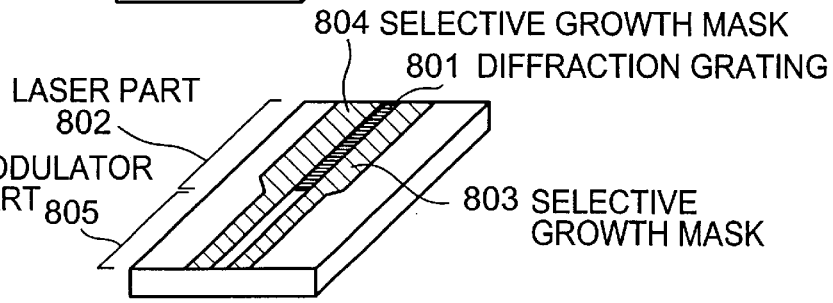
Figure 8C:
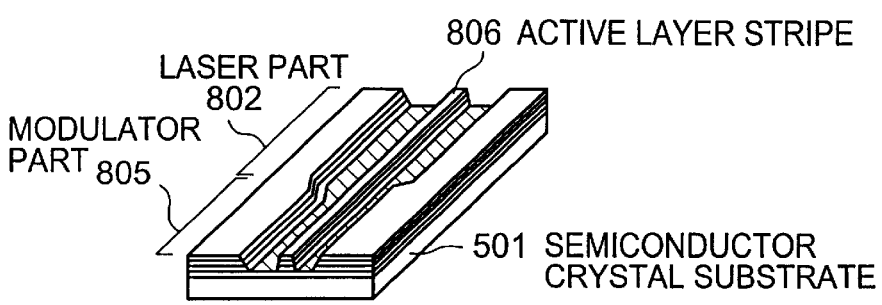
Figure 8D:
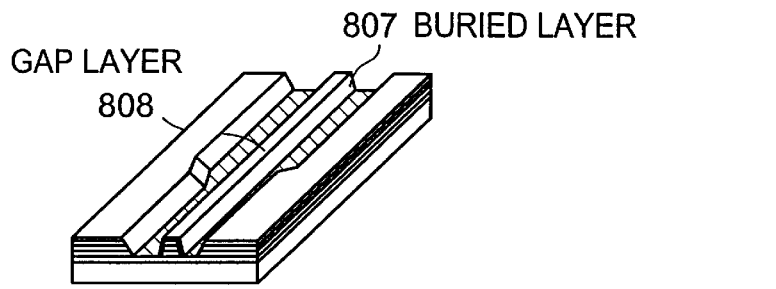
Figure 8E:
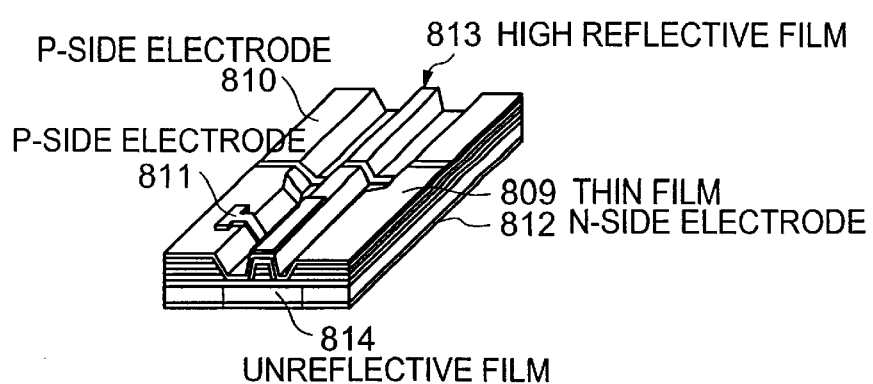

FIG. 7 is a diagrammatic illustration showing one example of a contact aligner used in the second embodiment. The contact aligner includes an irradiation system light source 701, an optical microscope 702, a mask holder 703, and a wafer holder 704.

The irradiation system light source 701 is a light source used in performing contact exposure. In the contact exposure, generally, exposure is performed using ultraviolet light. Thus, the wavelength of the irradiation system light source 701 is, for example, 350 to 450 nm.

The optical microscope 702 is used in aligning the mask 601 for exposure with the semiconductor crystal substrate 501. The optical microscope 702 has resolving power capable of sufficiently discriminating an object with a size of about 1 μm. When the contact exposure is performed, the optical microscope 702 is saved to the position so as not to interfere with the exposure.

The mask holder 703 secures the mask 601 for exposure by vacuum suction, and the wafer holder 704 secures the semiconductor crystal substrate 501 by vacuum suction. The mask holder 703 or the wafer holder 704 is driven by, for example, a stepping motor, etc. and vertical movement, rotation within a horizontal plane, and x, y-axial movement can be performed. For example, the x, y-axial and vertical movement can be performed by several μm (2 to 3 μm). Here, as one example, the x, y-aerial and vertical movement can be performed by 2 μm.

First, the distance between the mask holder 703 and the wafer holder 704 is enough kept. The semiconductor crystal substrate 501 and the mask 601 for exposure are secured on the wafer holder 704 and mask holder 703, respectively, by the vacuum suction. Then, the mask holder 703 is brought near over the wafer holder 704. In this case, the distance between the mask holder 703 and the wafer holder 704 is kept, for example, by several μm (2 to 3 μm). Here, as one example, the distance between the mask holder 703 and the wafer holder 704 is kept by 2 μm.

Next, an operator performs alignment by manipulating the mask holder 703 and the wafer holder 704 while observing the alignment pattern part 608 and the cleavage OF 502 through the optical microscope 702.

For example, one of the segment-shaped patterns 610 with the closest length to that of the cleavage OF 502 is selected from the group of the segment-shaped patterns 610 constituting the alignment pattern part 608. Next, orientation of the mask 601 for exposure is adjusted and this segment-shaped pattern 610 is brought into parallel with the cleavage OF 502 each other. Then, the mask 601 for exposure is moved to the position where the segment-shaped pattern 610 perfectly matches with the cleavage OF 502 parallel to itself. In this manner, the alignment is performed.

When the alignment is completed, the optical microscope 702 is saved to the position so as not to interfere with the contact exposure. Next, the mask 601 for exposure is overlaid on the semiconductor crystal substrate 501. Then, the mask 601 for exposure is brought into close contact with the semiconductor crystal substrate 501. Then, exposure is performed using the irradiation system light source 701 and the resist 504 is photosensitized. Thereafter, the stepper marker pattern part 602 and the EB markers 604, 605, 606, 607 are transferred on the semiconductor crystal substrate

501 through development, wet etching, removal of the resist 504, and wet etching.

Assuming that the length of the cleavage OF 502 is L and the distance from the center of the semiconductor crystal substrate 501 to the cleavage OF 502 is R, for a wafer with a diameter of 2 in. (50 mmφ), the following expression of relation holds with reference to R and L.

$R=SQRT(25^2-(L/2)^2)$ SQRT: square root

That is, the distance R from the center of the semiconductor crystal substrate 501 to the cleavage OF 502 is uniquely determined if the length L of the cleavage OF 502 is determined.

Therefore, each the marker can always be formed in the same position within the semiconductor crystal substrate 501 by overlaying the mask 601 for exposure to the position where the cleavage OF 502 is mutually parallel with the segment-shaped patterns 610 of the alignment pattern part 608 and both the ends of the cleavage OF 502 match with a circular arc pattern 609. Also, the crystal direction of the semiconductor crystal substrate 501 can be accurately aligned with the direction of each the marker.

Further, since it is necessary only that the cleavage OF 502 be parallel with the segment-shaped patterns 610, accurate alignment can be performed even in the absence of the segment shaped patterns 610 with the exactly same length as the cleavage OF 502.

FIG. 8 is a flow diagram showing formation processes of one element of an electroabsorption optical modulator (hereinafter called "modulator" for short) integrated type DFB laser.

First, a thin film 504 is removed. Next, a resist is applied on a semiconductor crystal substrate 501. Then, the semiconductor crystal substrate 501 and a reticle are mounted in a predetermined position of an EB aligner. Then, using an automatic alignment function of the EB aligner, the positions of EB markers 604, 605, 606, 607 are detected by an electron beam and alignment in the case of exposure is performed. Then, a diffraction grating pattern is transferred to a laser part 802 by EB exposure. Here, as one example, the diffraction grating pattern with a width of 10 μm, a length of 500 μm and a period of 241.7 nm is transferred in <011> direction. Then, etching is performed through development. Here, as one example, the etching is performed using etchant comprising hydrogen bromide, hydrogen peroxide and water. Thus, a diffraction grating 801 is formed on the semiconductor crystal substrate 501 (FIG. 8(*a*)).

Next, the resist is removed. Then, a thin film is formed on the semiconductor crystal substrate 501. As one example, the SiO$_2$ thin film with a thickness of 150 nm is formed by a thermal CVD method. Then, a resist is applied to the thin film. Then, a reticle and the semiconductor crystal substrate 501 are mounted in a predetermined position of a stepper aligner. Then, using an automatic alignment function of the stepper aligner, the position of each the stepper marker 603 is detected by a laser beam and alignment in the case of exposure is carried out and exposure is performed. Here, as one example, the exposure is performed using g-line. After that, a pair of stripe-shaped resist patterns are formed through development. Then, a pair of stripe-shaped selective growth masks 803 and 804 are formed on the thin film through wet etching and resist removal. Here, as one example, in a pair of the stripe-shaped selective growth masks 803 and 804, the space between the stripes is 1.5 μm in <011> direction, and the width and length of the stripe is 18 μm and 500 μm at the laser part 802, and the width and length of the stripe is 5 μm and 200 μm at a modulator part 805 (FIG. 8(*b*)).

Then, an active layer stripe 806 is formed by stacking an InGaAsP guide layer, a MQW active layer, an InGaAsP optical confinement layer, and a p-InP cladding layer in this order.

Here, as one example, the active layer stripe 806 is formed by sequentially stacking the InGaAsP guide layer (with a layer thickness of 0.1 μm, a carrier concentration of $5\times10^{17}$ cm$^{-3}$ and a band gap wavelength of 1.13 μm), the MOW active layer of eight periods obtained by alternately stacking well layers (with a strain of 0.5%, a layer thickness of 6 nm and a band gap wavelength of 1.54 μm at the laser part 802 and a band gap wavelength of 1.47 μm at the modulator part 805) and barrier layers (with a layer thickness of 8 nm and a band gap wavelength of 1.13 μm), the InGaAsP optical confinement layer (with a layer thickness of 60 nm, a carrier concentration of $5\times10^{17}$ cm$^{-3}$ and a band gap wavelength of 1.13 μm), and the p-InP cladding layer (with a layer thickness of 0.1 μm and a carrier concentration of $5\times10^{17}$ cm$^{-3}$) by a selective MOVPE method under a growth pressure of 75 Torr and a growth temperature of 625° C. (FIG. 8 (*c*)).

Then, the width of the modulator part of the selective growth masks 803 and 804 is widened by gamma ray stepper exposure and wet etching. Here, as one example, the width of the modulator part of the selective growth masks 803 and 804 is widened from 5 μm to 7 μm. Then, a buried layer 807 and an InGaAs cap layer 808 are formed in this order. Here, as one example, the buried layer 807 comprising a p-InP layer (with a layer thickness of 0.3 μm and a carrier concentration of $5\times10^{17}$ cm$^{-3}$) and a p-InP layer (with a layer thickness of 1.5 μm and a carrier concentration of $1\times10^{18}$ cm$^{-3}$), and the InGaAs cap layer 808 (with a layer thickness of 0.2 μm and a carrier concentration of $5\times10^{18}$ cm$^{-3}$) are formed in this order by a selective MOVPE method under a growth pressure of 75 Torr and a growth temperature of 625° C., and crystal growth is completed (FIG. 8(*d*)).

Then, a thin film 809 is formed. Here, as one example, the SiO$_2$ thin film with a thickness of 350 nm is formed. Then, a window for contact is opened by photolithography and wet etching. Then, Ti/Au are deposited by a sputtering method. Here, as one example, the Ti/Au are deposited by the thickness of 100/300 nm, respectively. Then, p-side electrodes 810 and 811 with putt structure are formed in the modulator part 805 and the laser part 802, respectively, by normal photolithography and wet etching. Then, the back of the semiconductor crystal substrate 501 is polished. As one example, the back of semiconductor crystal substrate 501 is polished to be formed in thickness to 100 μm. Then, Ti/Au are deposited on the back of semiconductor crystal substrate 501 by a sputtering method (as one example, the Ti/Au are deposited by the thickness of 100/300 nm, respectively), and an n-side electrode 812 is formed, and sintering is performed in an atmosphere of N$_2$.

Finally, each element is separated by cleavage, and a high reflective film 813 is formed on the end of the laser side and an unreflective film 814 is formed on the modulator side. As one example, the high reflective film 813 with a reflectance of 90% is formed on the end of the laser side and the unreflective film 814 with a reflectance of 0.1% is formed on the modulator side. Thus, a modulator integrated type DFB semiconductor laser element is completed (FIG. 8(*e*)).

As described above, the stepper markers 603 and the EB markers 604, 605, 606, 607 can always be formed in the same position within the semiconductor crystal substrate 501 by aligning the semiconductor crystal substrate 501 with the mask 601 for exposure. As a result, in a stepper exposure process, by using a stepper aligner with an automatic alignment function, the position of each the stepper marker 603 can be detected by a laser beam etc. to automatically perform alignment. Also, in an EB exposure process, by using an EB aligner with an automatic alignment function, the positions of the EB markers 604, 605, 606, 607 can be detected by an electron beam etc. to automatically perform alignment.

Also, the crystal axis direction (<011> direction) of the semiconductor crystal substrate 501 can be accurately aligned with the directions of each the stepper marker 603 and the EB markers 604, 605, 606, 607. As a result, the deviation of angle of the selective growth masks 803 and 804 (thus, the active layer stripe 806) to the crystal axis direction can be reduced to 0.01 degrees or less. Further, alignment accuracy between the diffraction grating 801 and the active layer stripe 806 is kept to 0.5 μm or less.

Since each the stepper marker 603 and the EB markers 604, 605, 606, 607 are formed in the same position within the semiconductor crystal substrate 501 and the directions of each the stepper marker 603 and the EB markers 604, 605, 606, 607 are accurately aligned with the crystal axis direction of the semiconductor crystal substrate 501, the shape and the period of the diffraction grating 801 and the width of the active layer stripe 806 can be controlled with enough high accuracy and a semiconductor laser having good characteristics can be manufactured.

When the modulator integrated type DFB semiconductor laser element manufactured as described above was evaluated, a laser oscillation threshold was 8 mA, and light output at 100 mA was 15 mW, and a quenching ratio when applying a reverse bias voltage of 2V was 15 dB or higher in a modulator, and a good eye opening at a modulation rate of 2.5 Gb/s was obtained. Further, even in a transmission test by a normal fiber with 120 km at a modulation rate of 2.5 Gb/s, a good result with a penalty of 1 dB or lower was obtained.

A third embodiment of a manufacturing method of a semiconductor device and an alignment method according to the present invention will be described with reference to FIGS. 9 to 11.

Figure 9:
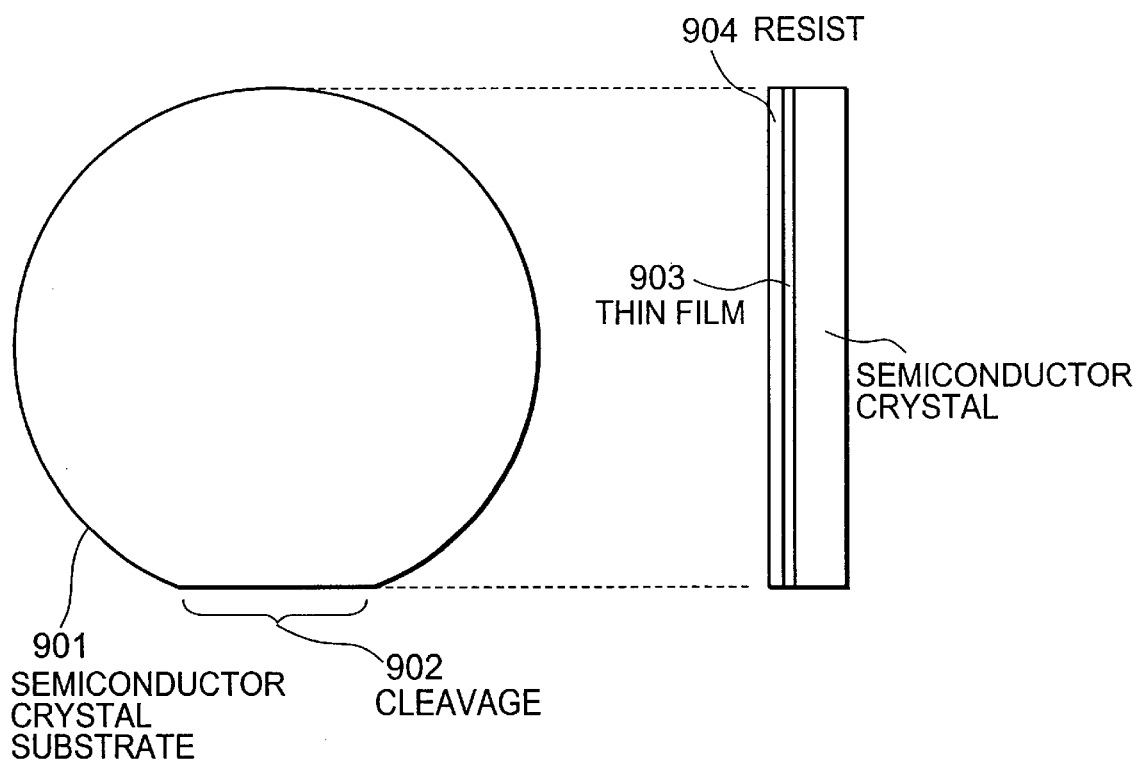
FIG. 9 is an illustration showing a configuration example of a semiconductor crystal substrate in a third embodiment.

FIG. 9 is an illustration showing a configuration example of a semiconductor crystal substrate in the third embodiment. A semiconductor crystal substrate 901 has a cleavage OF 902. Here, as one example, a substrate with a diameter of 2 in. comprising an n-type InP crystal with (100) plane orientation, in which the cleavage OF 902 is 20 mm in length and a carrier concentration is $1 \times 10^{18}$ cm$^{-3}$, is used for the semiconductor crystal substrate 901. A thin film 903 is formed on the main surface of the semiconductor crystal substrate 901. Here, as one example, the SiO$_2$ film with a thickness of 100 nm is formed (for example, by a thermal CVD method). A resist 904 is applied on the thin film 903.

Figure 10:
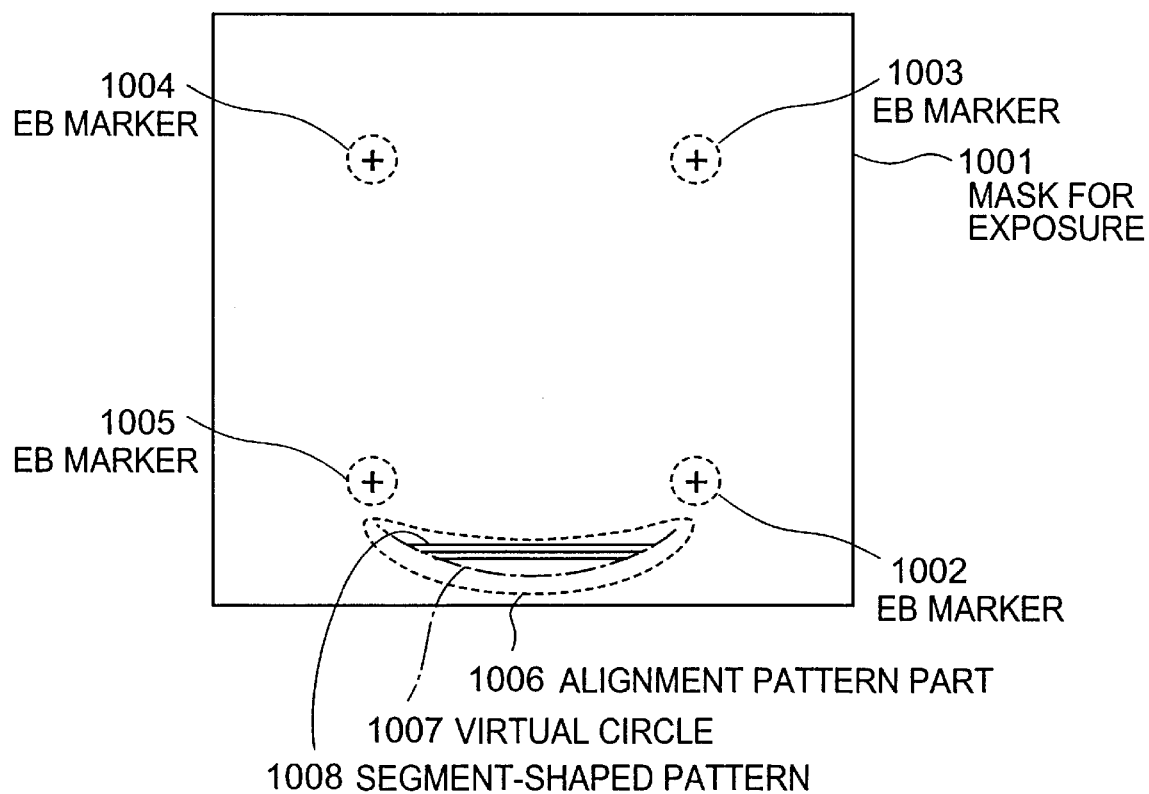
FIG. 10 is a plan view showing a mask for exposure in the third embodiment.

FIG. 10 is a plan view showing a mask for exposure in the third embodiment. A mask 1001 for exposure comprises, for example, a transparent quartz glass substrate. EB markers 1002, 1003, 1004, 1005 and an alignment pattern part 1006 are formed on the main surface of the mask 1002 for exposure.

The EB markers 1002, 1003, 1004, 1005 are formed of a thin film for shading. The thin film for shading includes, for example, metal such as chromium, silicon, molybdenum silicide.

The alignment pattern part 1006 comprises plural segment-shaped patterns 1008 which correspond to a chord of a virtual circle 1007 matching with an outer peripheral circle of the semiconductor crystal substrate 901 and are arranged parallel one another at regular intervals. In consideration of machining accuracy of the cleavage OF 902, the length of the segment-shaped pattern 1008 with the position near to the center of the virtual circle 1007 is longer than that of the cleavage OF 902, and the length of the segment-shaped pattern 1008 with the position distant from the center of the virtual circle 1007 is shorter than that of the cleavage OF 902. The space between the adjacent segment-shaped patterns 1008 is, for example, 100 to 200 μm. Here, as one example, the space between the adjacent segment-shaped patterns 1008 is set to 100 μm. Each segment-shaped pattern 1008 is formed of a thin film for shading. The thin film for shading includes, for example, metal such as chromium, silicon, molybdenum silicide.

Figure 11:
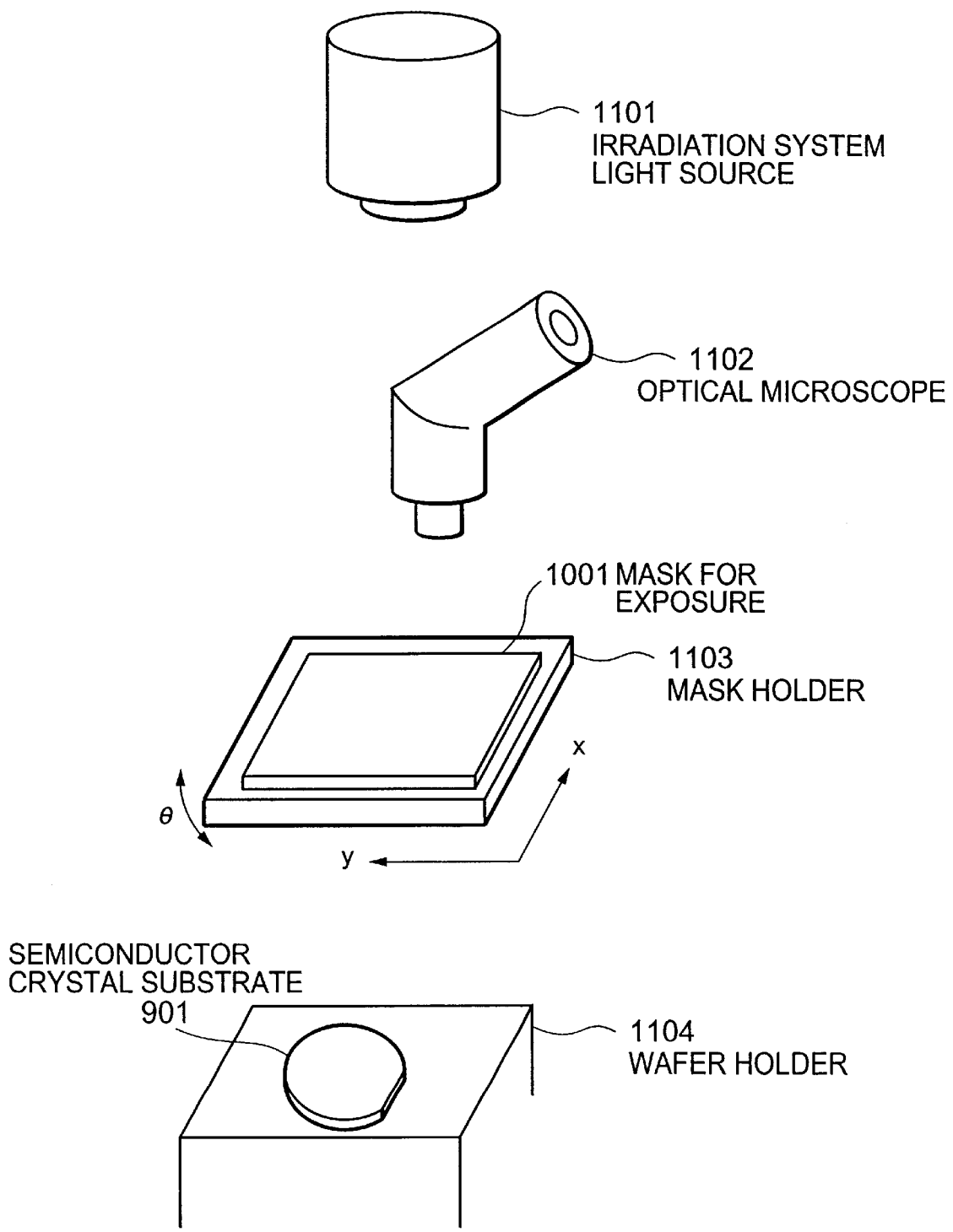
FIG. 11 is an illustration showing one example of a contact aligner used in the third embodiment.

FIG. 11 is a diagrammatic illustration showing one example of a contact aligner used in the third embodiment. The contact aligner includes an irradiation system light source 1101, an optical microscope 1102, a mask holder 1103, and a wafer holder 1104.

The irradiation system light source 1101 is a light source used in performing contact exposure. In the contact exposure, generally, exposure is performed using ultraviolet light. Thus, the wavelength of the irradiation system light source 1101 is, for example, 350 to 450 nm.

The optical microscope 1102 is used in aligning the mask 1001 for exposure with the semiconductor crystal substrate 901. The optical microscope 1102 has resolving power capable of sufficiently discriminating an object with a size of about 1 μm. When the contact exposure is performed, the optical microscope 1102 is saved to the position so as not to interfere with the exposure.

The mask holder 1103 secures the mask 1001 for exposure by vacuum suction, and the wafer holder 1104 secures the semiconductor crystal substrate 901 by vacuum suction. The mask holder 1103 or the water holder 1104 is driven by, for example, a stepping motor, etc. and vertical movement, rotation within a horizontal plane, and x, y-axial movement can be performed. For example, the x, y-axial movement can be performed by 2 to 3 μm.

First, the distance between the mask holder 1103 and the water holder 1104 is enough kept. The semiconductor crystal substrate 901 and the mask 1001 for exposure are secured on the wafer holder 1104 and mask holder 1103, respectively, by the vacuum suction. Then, the mask holder 1103 is brought near over the wafer holder 1104. In this case, the distance between the mask holder 1103 and the wafer holder 1104 is kept, for example, by several μm (2 to 3 μm). Here, as one example, the distance between the mask holder 1103 and the wafer holder 1104 is kept by 2 μm.

Next, an operator performs alignment by manipulating the mask holder 1103 and the wafer holder 1104 while observing the alignment pattern part 1006 and the cleavage OF 902 through the optical microscope 1102.

For example, one of the segment-shaped patterns 1008 with the closest length to that of the cleavage OF 902 is selected from the group of the segment-shaped patterns 1008 constituting the alignment pattern part 1006. Next, orientation of the mask 1001 for exposure is adjusted and this segment-shaped pattern 1008 is brought into parallel with the cleavage OF 902 each other. Then, the mask 1001 for exposure is moved to the position where the segment-shaped pattern 1008 matches with the cleavage OF 902 parallel to itself. In this manner, the alignment is performed.

When the alignment is completed, the optical microscope 1102 is saved to the position so as not to interfere with the contact exposure. The mask 1001 for exposure is overlaid on the semiconductor crystal substrate 901. The mask 1001 for exposure is brought into close contact with the semiconductor crystal substrate 901. Then, exposure is performed using the irradiation system light source 1101 and a resist is photosensitized, Thereafter, the EB markers 1002, 1003, 1004, 1005 are transferred on the semiconductor crystal substrate 901 through development, wet etching, resist removal and wet etching.

Assuming that the length of the cleavage OF 902 is L and the distance from the center of the semiconductor crystal substrate 901 to the cleavage OF 902 is R, for a wafer with a diameter of 2 in. (50 mmϕ), the following expression of relation holds with reference to R and L.

$$R = SQRT(25^2 - (L/2)^2)\ SQRT:\ \text{square root}$$

That is, the distance R from the center of the semiconductor crystal substrate 901 to the cleavage OF 902 is uniquely determined if the length L of the cleavage OF 902 is determined.

Therefore, each the marker can always be formed in the same position within the semiconductor crystal substrate 901 by overlaying the mask 1001 for exposure to the position where the cleavage OF 902 is mutually parallel with the segment-shaped patterns 1008 and both the ends of the cleavage OF 902 match with a circular arc pattern 1007. Then, the crystal direction of the semiconductor crystal substrate 901 can be accurately aligned with the direction of each the marker.

Also, since it is necessary only that the cleavage OF 902 be parallel with the segment-shaped patterns 1008, accurate alignment can be performed even in the absence of the segment-shaped patterns 1008 with the exactly same length as the cleavage OF 902. Further, even it the cleavage OF 902 and the segment-shaped patterns 1008 overlap one another in the case of aligning the semiconductor crystal substrate 901 with the mask 1001 for exposure, a pattern is not formed at the intersection of the segment-shaped patterns 1008 and the circular arc pattern 1007, so that both the ends of the cleavage OF 902 can be observed to perform more accurate alignment.

Figure 12A:
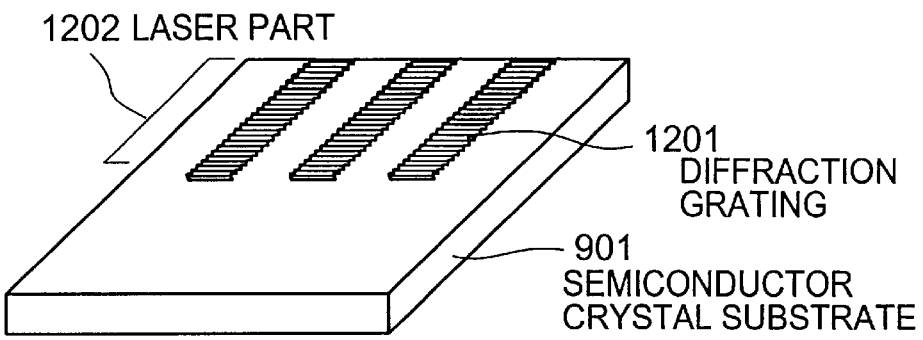
FIGS. 12(A)–12(C) is a flow diagram showing processes of manufacturing 16 kinds of modulator integrated type DFB lasers with a different oscillation wavelength on the same substrate.
Figure 12B:
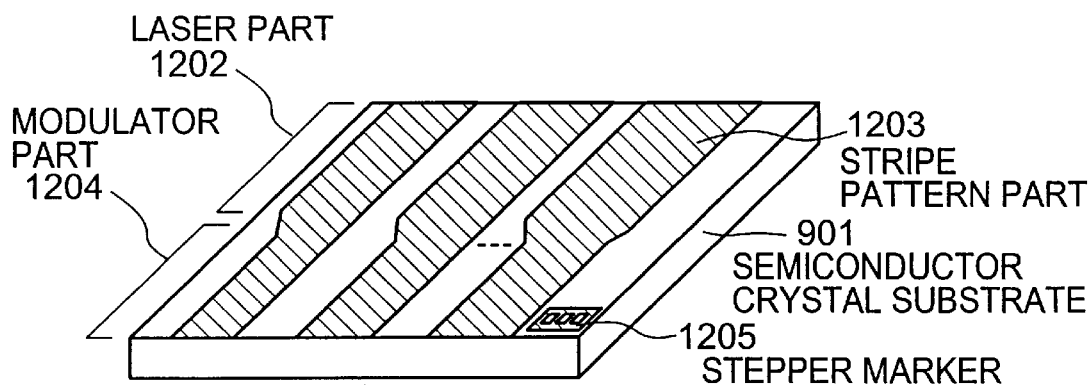
Figure 12C:
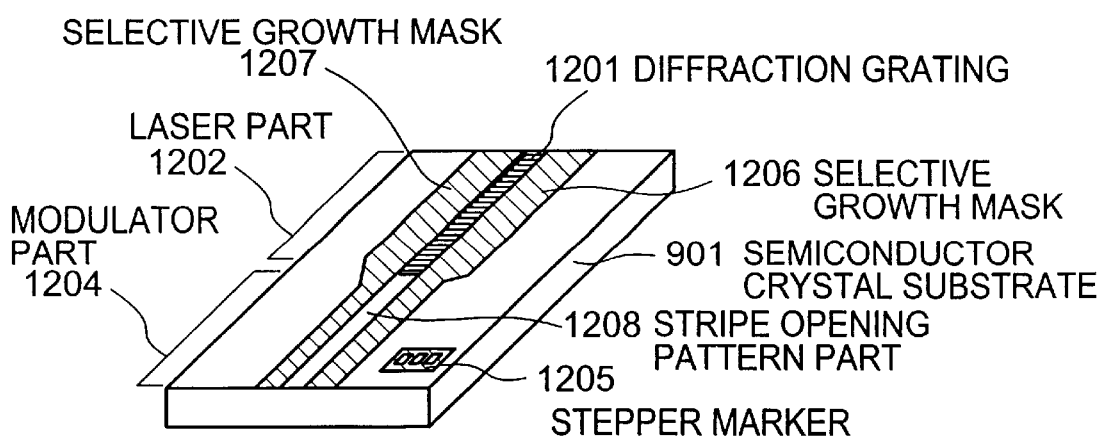
Figure 13A:
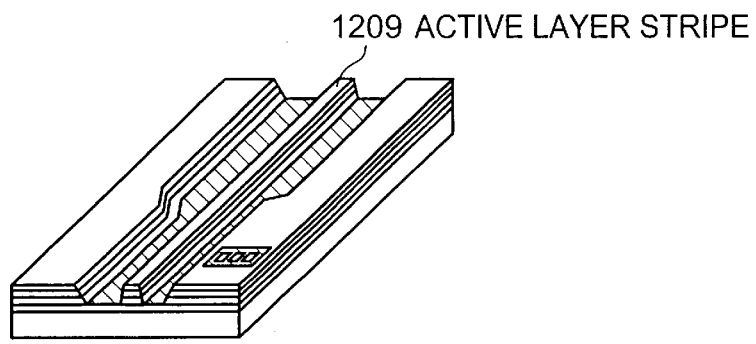
FIGS. 13(A)–13(C) is a flow diagram showing processes of manufacturing 16 kinds of modulator integrated type DFB lasers with a different oscillation wavelength on the same substrate.
Figure 13B:
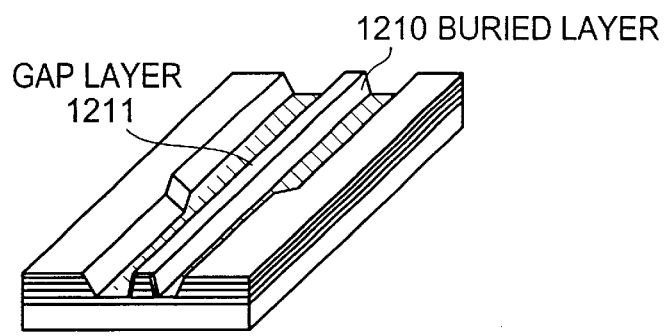
Figure 13C:
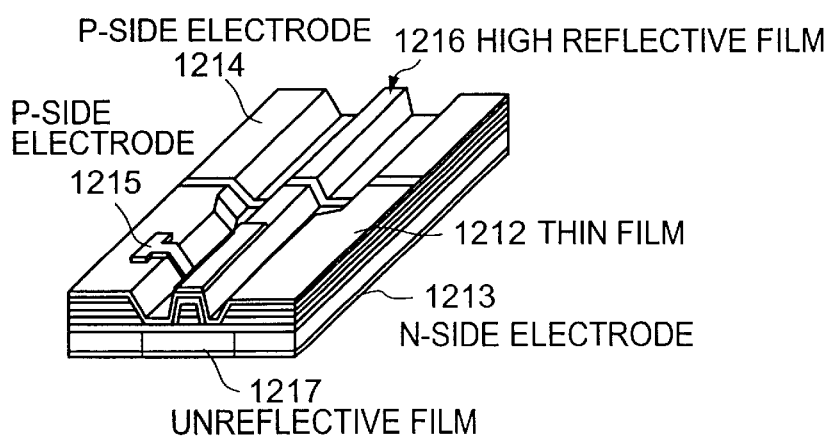

FIGS. 12 and 13 are flow diagrams showing processes of manufacturing 16 kinds of modulator integrated type DFB lasers with a different oscillation wavelength on the same substrate.

First, a thin film 903 is removed. Next, a resist is applied on a semiconductor crystal substrate 901. Then, the semiconductor crystal substrate 901 and a reticle are mounted in a predetermined position of an EB aligner. Then, using an automatic alignment function of the EB aligner, the positions of EB markers 1002, 1003, 1004, 1005 are detected by an electron beam and alignment in the case of exposure is performed. Then, a pattern of diffraction gratings 1201 is transferred to a laser part 1202 by EB exposure. Here, as one example, the pattern of the diffraction gratings 1201 of 16 kinds with a width of 10 μm, a length of 500 μm and different periods which are lengthened from 241.7 nm in steps of 0.125 nm is transferred in <011> direction. Thereafter, etching is performed using etchant comprising hydrogen bromide, hydrogen peroxide and water through development, and the diffraction gratings 1201 are formed on the semiconductor crystal substrate (FIG. 12(a)).

Next, the resist is removed. Then, an SiO₂ thin film with a thickness of 100 nm is formed by a thermal CVD method. Then, the semiconductor crystal substrate 901 and a mask for exposure are mounted in a predetermined position of a contact aligner. Stripe patterns with 16 kinds of different widths and a stepper marker pattern are formed on the mask for exposure. Then, on the basis of the EB markers 1002, 1003, 1004, 1005, the semiconductor crystal substrate 901 is aligned with the mask for exposure, and the mask for exposure is brought into close contact with the semiconductor crystal substrate 901. Then, exposure is performed, and the stripe patterns with 16 kinds of different widths and the stepper marker pattern are transferred. After that, a stepper marker pattern 1205 and stripe patterns 1203 with 16 kinds of different widths are formed of the semiconductor crystal substrate 901 through development, wet etching and resist removal. Here, as one example, the stripe patterns 1203 with 16 kinds of different widths, in which at the laser part 1202, the length is 500 μm and the width widens from 38 μm in steps of 1 μm with an increase in the diffraction grating period and at a modulator part 1204, the length is 200 μm and the width widens from 12 μm in steps of 0.5 μm with a change in the diffraction grating period in a manner similar to the laser part 1202, are formed in <0111> direction (FIG. 12(b)).

Then, by gamma ray stepper and wet etching, a stripe opening pattern 1208 with a width of 1.5 μm is formed in the center of the stripe patterns 1203 and selective growth masks 1206 and 1207 are formed (FIG. 12(c)).

Then, an active layer stripe 1209 is formed by stacking an InGaAsP guide layer, a MQW active layer, an InGaAsP optical confinement layer, and a p-InP cladding layer in this order.

Here, as one example, the active layer stripe 1209 is formed by sequentially stacking the InGaAsP guide layer (with a layer thickness of 0.1 μm, a carrier concentration of $5 \times 10^{17}$ cm⁻³ and a band gap wavelength of 1.13 μm), the MQW active layer of eight periods having well layers (with a strain of +0.5%, a layer thickness of 6 nm and a band gap wavelength of 1.54 μm) at the laser part 1202 and barrier layers (with a layer thickness of 8 nm and a band gap wavelength of 1.13 μm), the InGaAsP optical confinement layer (with a layer thickness of 60 nm, a carrier concentration of $5 \times 10^{17}$ cm⁻³ and a band gap wavelength of 1.13 μm), and the p-InP cladding layer (with a layer thickness of 0.1 μm and a carrier concentration of $5 \times 10^{17}$ cm⁻³) by a selective MOVPE method under a growth pressure of 75 Torr and a growth temperature of 625° C. (FIG. 13(a)).

Then, the width of the modulator part 1204 of the selective growth masks 1206 and 1207 is widened by gamma ray stepper exposure and wet etching. Here, as one example, the width of the modulator part 1204 of the selective growth masks 1206 and 1207 is widened from 5 μm to 7 μm. Then, a buried layer 1210 and an InGaAs cap layer 1211 are formed in this order. Here, as one example, the buried layer 1210 comprising a p-InP layer (with a layer thickness of 0.3 μm and a carrier concentration of $5 \times 10^{17}$ cm⁻³) and a p-InP layer (with a layer thickness of 1.5 μm and a carrier concentration of $1 \times 10^{18}$ cm⁻³), and the InGaAs cap layer 1211 (with a layer thickness of 0.2 μm and a carrier concentration of $5 \times 10^{18}$ cm⁻³) are formed in this order by a selective MOVPE method under a growth pressure of 75 Torr and a growth temperature of 625° C., and crystal growth is completed (FIG. 13(b)).

Then, a thin film 1212 is formed. Here, as one example, the SiO₂ thin film with a thickness of 350 nm is formed. Then, a window for contact is opened by photolithography and wet etching. Then, Ti/Au are deposited by a sputtering method. Here, as one example, the Ti/Au are deposited by the thickness of 100/300 nm, respectively. Then, p-side electrodes 1214 and 1215 with putt structure are formed in the modulator part 1204 and the laser part 1202, respectively, by normal photolithography and wet etching. Then, the back of the semiconductor crystal substrate 901 is polished. As one example, the back of semiconductor crystal substrate 901 is polished to be formed in thickness to 100 μm. Then, Ti/Au are deposited on the back of semiconductor crystal substrate 901 by a sputtering method (as one example, the Ti/Au are deposited by the thickness of 100/300 nm, respectively), and an n-side electrode 1213 is formed, and sintering is performed in an atmosphere of $N_2$.

Finally, each element is separated by cleavage, and a high reflective film 1216 is formed on the end of the laser side and an unreflective film 1217 is formed on the modulator side. As one example, the high reflective film 1216 with a reflectance of 90% is formed on the end of the laser side and the unreflective film 1217 with a reflectance of 0.1% is formed on the modulator side. Thus, a modulator integrated type DFB semiconductor laser element is completed (FIG. 13(*c*)).

As described above, the stepper markers and the EB markers can always be formed in the same position within the semiconductor crystal substrate 901 by aligning the semiconductor crystal substrate 901 with the mask for exposure. As a result, by using a stepper aligner and an EB aligner with an automatic alignment function, transfer of each the stepper marker and each the EB marker can be automated.

Also, the crystal direction of the semiconductor crystal substrate 901 can be accurately aligned with the directions of the stepper marker pattern and the EB marker pattern. As a result, the deviation of angle of the selective growth masks 1206 and 1207 (thus, the active layer stripe 1209) to <011> direction can be reduced to 0.01 degrees or less.

When the elements manufactured in the present embodiment were evaluated, 16 kinds of laser oscillation wavelengths ranging from 1555 nm to 1567.8 nm in steps of 0.8 nm according to different diffraction grating periods were obtained, and in each the element, a laser oscillation threshold was 8 mA and light output at 100 mA was 15 mW and a quenching ratio when applying a reverse bias voltage of 2V was 15 dB or higher in a modulator and a good eye opening at a modulation rate of 2.5 Gb/s was obtained.

According to the present invention as described above, markers can be formed in the same position within a semiconductor crystal substrate. As a result of this, using an aligner with an automatic alignment function, positions of the markers can be detected to automatically perform alignment in the case of exposure. Thus, operating efficiency of an exposure process improves and high productivity can be obtained.

Then, the crystal axis direction of the semiconductor crystal substrate can be accurately aligned with the directions of the markers. As a result of this, an optical waveguide can be formed in parallel with the crystal axis direction with enough high accuracy. Also, the width of an active layer stripe and the shape and period of a diffraction grating in a DFB laser can be controlled well. As a result of this, a semiconductor laser having good characteristics can be manufactured.

What is claimed is:

1. A method of manufacturing a semiconductor device including a step of transferring a pattern formed in a mask for exposure on a semiconductor crystal substrate, comprising the steps of:

providing the semiconductor crystal substrate having a cleavage orientation flat;

providing the mask for exposure in which an alignment pattern is formed, the alignment pattern comprising a segment-shaped pattern which is a chord joining two points on a circular arc matching with an outer peripheral circle of the semiconductor crystal substrate and corresponds to the cleavage orientation flat;

aligning the mask for exposure with the semiconductor crystal substrate so as to match the cleavage orientation flat with the segment-shaped pattern; and transferring the pattern formed in the mask for exposure on the semiconductor crystal substrate.

2. A method of manufacturing a semiconductor device according to claim 1, wherein the alignment pattern comprises plural segment-shaped patterns which are a chord joining two points on a circular arc matching with an outer peripheral circle of the semiconductor crystal substrate and are parallel one another.

3. A method of manufacturing a semiconductor device according to claim 2, wherein the semiconductor crystal substrate is aligned with the mask for exposure so that said cleavage orientation flat is overlaid on the segment-shaped pattern best matching with the cleavage orientation flat among the plural segment-shaped patterns.

4. In an alignment method performed when transferring a pattern formed in a mask for exposure on a semiconductor crystal substrate, the alignment method in manufacture of a semiconductor device, comprising the steps of:

forming an alignment pattern in the mask for exposure, the alignment pattern comprising a segment-shaped pattern which is a chord joining two points on a circular arc matching with an outer peripheral circle of the semiconductor crystal substrate having a cleavage orientation flat and corresponds to the cleavage orientation flat; and aligning the mask for exposure with the semiconductor crystal substrate so as to match the cleavage orientation flat with the segment-shaped pattern.

5. An alignment method according to claim 4, wherein the alignment pattern comprises plural segment-shaped patterns which are a chord joining two points on a circular arc matching with an outer peripheral circle of the semiconductor crystal substrate and are parallel one another.

6. An alignment method according to claim 5, wherein the semiconductor crystal substrate is aligned with the mask for exposure so that said cleavage orientation flat is overlaid on the segment-shaped pattern best matching with the cleavage orientation flat among the plural segment-shaped patterns.

7. A mask for exposure for transferring a pattern on a semiconductor crystal substrate, the mask having plural segment-shaped patterns which are a chord joining two points on a circular arc matching with an outer peripheral circle of the semiconductor crystal substrate and are parallel one another.

* * * * *

UNITED STATES PATENT AND TRADEMARK OFFICE
CERTIFICATE OF CORRECTION

PATENT NO. : 6,319,638 B1
DATED : November 20, 2001
INVENTOR(S) : Yasumasa Inomoto Page 1 of 1

It is certified that error appears in the above-identified patent and that said Letters Patent is hereby corrected as shown below:

Column 8,
Line 32, delete "y-aerial" insert -- y-axial --

Column 10,
Line 8, "MOW" insert -- MQW --

Column 12,
Lines 34 and 40, delete "water" insert -- wafer --

Column 14,
Line 16, delete "<0111>" insert -- <011> --

Signed and Sealed this

Second Day of April, 2002

Attest:

Attesting Officer

JAMES E. ROGAN
Director of the United States Patent and Trademark Office